(12) United States Patent
Glovatsky et al.

(10) Patent No.: US 6,299,469 B1
(45) Date of Patent: Oct. 9, 2001

(54) FLEXIBLE CIRCUIT BOARD SPLICE CLAMP

(75) Inventors: Andrew Zachary Glovatsky, Plymouth; Pawel Kalinowski, Birmingham; Richard Keith McMillan, Dearborn, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/553,204

(22) Filed: Apr. 20, 2000

Related U.S. Application Data
(60) Provisional application No. 60/130,860, filed on Apr. 22, 1999.

(51) Int. Cl.[7] .................................................. H01R 13/62
(52) U.S. Cl. ............................................ 439/329; 439/507
(58) Field of Search .......................... 439/329, 507, 439/67, 499, 418, 422; 361/776; 337/381, 418

(56) References Cited

U.S. PATENT DOCUMENTS

| | | | |
|---|---|---|---|
| 3,038,140 | * 6/1962 | Haberland | 439/329 |
| 3,824,529 | * 7/1974 | Dorrell | 439/418 |
| 5,934,930 | * 8/1999 | Camps et al. | 439/425 |
| 6,132,236 | * 10/2000 | Kozel et al. | 439/395 |
| 6,193,544 | * 2/2001 | McGinnis | 439/492 |

* cited by examiner

*Primary Examiner*—Brian Sircus
*Assistant Examiner*—Brian S. Webb
(74) *Attorney, Agent, or Firm*—Larry I. Shelton

(57) ABSTRACT

Disclosed herein is a method and apparatus for splicing flexible circuit boards, particularly those having one or more flexible strip extensions with conductor runs. The splice clamp of the present invention has two hinged plates that clamp over unconnected ends of two flexible circuit board segments. The splice clamp includes alignment guides for aligning the segments in the clamp so that one or more jumpers contact and provide an electrical bridge between the conductors of the segments when the plates are clamped together. The jumpers contact conductive pads of larger size than the conductor runs to ensure electrical coupling between the flexible circuit board segments. The jumpers may have pointed tips that cut through insulation. The clamp includes flexible clasps on one plate that engage with catch surfaces on the other plate to lock the flexible circuit board segments spliced together.

29 Claims, 6 Drawing Sheets

FLEXIBLE CIRCUIT BOARD SPLICE CLAMP

CROSS-REFERENCE TO RELATED APPLICATIONS

This application claims benefit to U.S. provisional application serial No. 60/130,860, filed Apr. 22, 1999.

BACKGROUND OF THE INVENTION

The present invention relates generally to printed circuit boards and in particular to a method and apparatus for splicing segments of flexible circuit boards when servicing or replacing electronic components in automobiles.

Automobiles include many complex electrical assemblies for use in sophisticated engine control systems including a variety of sensors for detecting such conditions as engine temperature, throttle position, engine speed and air intake. These control systems typically include microprocessors to process the signals from these sensors and produce control signals for operating engine components such as throttle valves, ignition coils and fuel injectors.

Ordinarily, the electronics in such control systems are interconnected via a printed circuit board. Printed circuit boards are used because they provide reliable connection between the electronic components. Typical circuit boards have a rigid substrate on which the circuit is printed. Due to their rigid construction, the electronics on the circuit board must be connected to sensors and vehicle components by a wiring harness. Wiring harnesses are costly and are prone to failure in the connection of the harness to the circuit board but also in the connection to connector pins. Moreover, wiring harnesses clutter the engine compartment making it more difficult to assemble and service the engine.

One method of providing reliable connections without using bulky and expensive wiring harnesses is to use flexible circuit boards typically made of a conductive layer laminated to a flexible insulating substrate. Such flexible circuit boards can be fabricated to include finger-like extensions that are sufficiently flexible to follow a curved path between the control circuitry and the sensor or vehicle component.

Such flexible circuit boards provide the advantage of obviating wire harnesses. Moreover, using such circuit boards can also eliminate pin connectors between the circuit board and the sensors or vehicle components, which can decrease cost as well as connection related problems. However, like wires, the finger-like extensions can be damaged from flexure and abrasion occurring during normal use of the automobile. And, without connectors between the circuit board and the sensors or components, it is ordinarily more difficult and expensive to service or replace components of the electrical assembly. This is because the remote components are directly connected to a main circuit board by the integral extensions. Thus, replacing one sensor or vehicle component ordinarily requires that the entire assembly to which it is connected be replaced.

BRIEF SUMMARY OF THE INVENTION

The present invention provides a connector for splicing uniquely configured flexible circuit boards when servicing electrical assemblies. In an automobile environment, the present invention permits the use of flexible circuit boards having integral finger-like extensions running directly to vehicle components without using connectors such that a single electronic component can be replaced without replacing the entire assembly.

Specifically, the present invention provides a clamp for splicing flexible circuit boards each having a flexible substrate supporting an electrically conductive circuit with at least one electrically conductive contact pad proximate alignment openings. The clamp has a first plate with a lateral channel sized to receive the circuit boards as well as alignment posts projecting from within the channel. The clamp also has a second plate hinged to the first plate. The second plate has alignment post recesses and one or more lateral metallic jumpers with conductive ends extending toward the first plate. In use, the circuit boards are aligned end to end in the first plate and the plates are clamped together. This causes the jumper to contact the contact pads of each circuit board and couple them electrically.

One aspect of the present invention is a kit for use with an automobile electronic assembly. The electronic assembly has a first electronic component mounted to a flexible circuit board with a finger-like extension. The extension is made of a flexible substrate supporting runs of conductors having electrically conductive contact pads. The kit includes a second electronic component having electrical terminals, a replacement extension and a splice connector. The replacement extension is made of a flexible substrate supporting runs of conductors having electrically conductive contact pads at one end. The replacement extension is electrically coupled to the electrical terminals of the second component at another end. The splice connector has conductive jumpers that bridge the contact pads of the extension to the contact pads of the replacement extension so that the first electronic component is electrically coupled to the second electronic component.

Another aspect of the invention is a method for servicing electronic assemblies in automobiles having a first electronic component with a flexible circuit board and a flexible extension supporting conductor runs that couple the first electronic component to a second electronic component. The flexible circuit extension is cut cross-wise so that the extension is in two segments. A first segment is connected to the first electronic component and a second segment is connected to the second electronic component. Then, the first electronic component and the first extension segment are removed and a replacement component is installed. The free ends of the second extension segment and a replacement extension segment are brought together so that the conductor runs of the second extension segment are aligned with conductor runs of the replacement extension segment. A splice connector is then clamped over the free ends so that metallic jumpers bridge the conductor runs of the extension segments.

Still another aspect of the invention includes a flexible circuit board having a conductor circuit supported by a flexible substrate. Finger-like extensions of the board support runs of conductors connected at one end to the conductor circuit of the board body. The extensions have a pre-defined splice region wherein the splice region is defined by laterally aligned conductive contact pads coupled to the conductor runs of increased width than the conductor runs.

Thus, the present invention provides a quick and easy method and apparatus for servicing electrical assemblies connected via a flexible circuit board. The present invention also obviates separate pin connectors between the components in the assembly, allowing the components to be directly connected to the flexible board. Despite this, only the failed or damaged components can be replaced without replacing the entire assembly. Thus, the present invention reduces initial material and assembly costs by obviating connectors and reduces replacement costs by facilitating replacement of only the failed or damaged component(s).

The foregoing and other objects and advantages of the invention will appear from the following description. In the description, reference is made to the accompanying drawings which form a part hereof, and in which there is shown by way of illustration a preferred embodiment of the invention.

DETAILED DESCRIPTION OF THE PREFERRED EMBODIMENT

Figure 1:
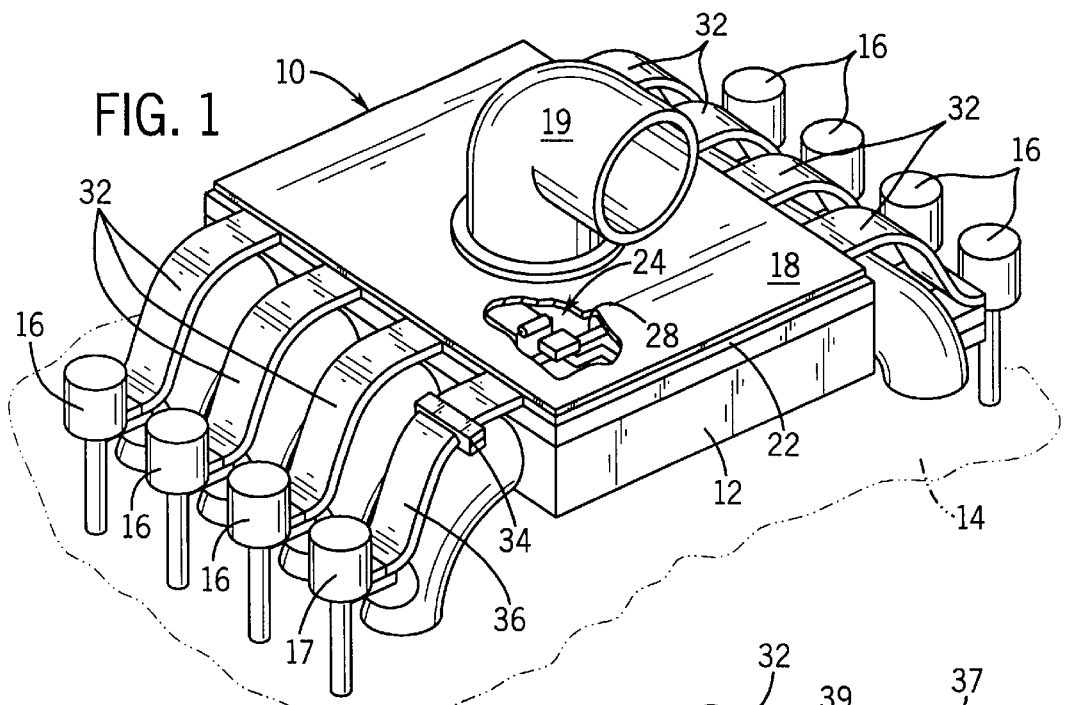
FIG. 1 is a front perspective view of an engine control unit (ECU) mounted atop an engine air intake manifold having a flexible circuit board with extensions leading from the ECU to ignition coils.
Figure 5A:
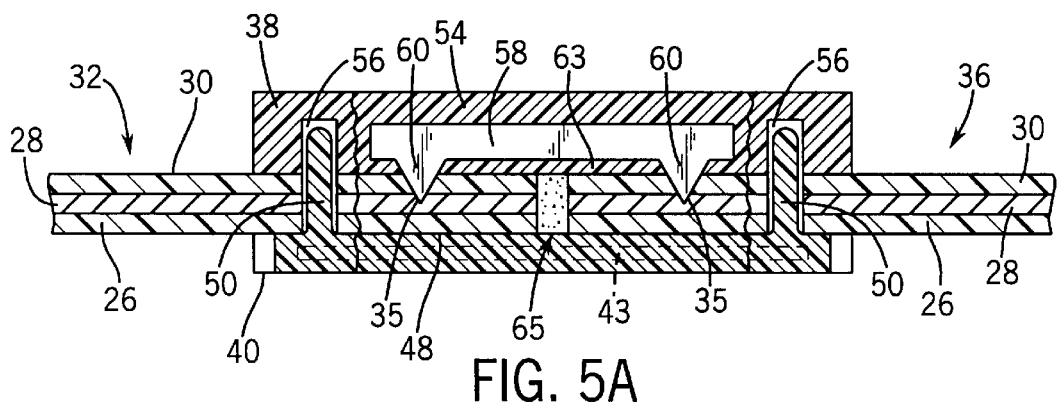
FIG. 5A is an end cross-sectional view taken along line 5A—5A of FIG. 4 showing a jumper connection.

FIG. 1 shows an engine control unit (ECU) housing 10 mounted atop an air intake manifold 12 of an eight cylinder internal combustion engine 14 (shown in phantom) having individual ignition coils 16 and fuel injectors (not shown) mounted at each cylinder. The ECU housing 10 includes a protective cover 18, through which extends a throttle body elbow 19, that can be removed to access to the ECU circuitry within the housing 10. The ECU circuitry 20 is mounted on a panel portion 22 of a flexible printed circuit board 24. Referring briefly to FIG. 5A, the flexible circuit board 24 is comprised of a flexible substrate 26 supporting an electrically conductive layer 28 which is coated with a thin insulating layer 30. Preferably, the flexible circuit board 24 is an etched-tri-metal composite circuit board having an aluminum layer separating two layers of copper, however for clarity, the figures show only one conductive layer. Also, it should be noted that the present invention can be used with flexible circuit board of any composition and suitable configuration.

Figure 1A:
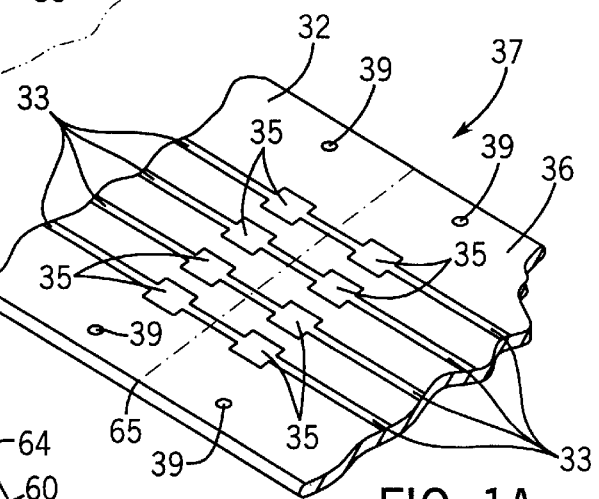
FIG. 1A is an enlarged view of a splice region of a flexible circuit board extension in FIG. 1.

Referring again to FIG. 1, the flexible circuit board 24 includes eight fingerlike extensions 32 electrically connecting the ECU circuitry 20 to each ignition coil 16 and fuel injector. The extensions 32 are integral with and of the same flexible circuit board as the panel portion 22 so that they can follow the profile of the air intake manifold 12. Referring to FIG. 1A momentarily, the extensions 32 include four conductor runs 33 (two for each coil and fuel injector) preferably aligned in parallel running the length of the extensions 32. Each conductor run includes a conductive contact pad 35 of increased area. The contact pads 35 are laterally aligned at a splice region 37 near the top of each extension 32. A pair of alignment openings 39 are disposed in the splice region 37 at the sides of the contact pads 35.

Returning to FIG. 1, preferably, the extensions 32 are hardwired directly to terminals (not shown) of the ignition coils 16 and fuel injectors. In this way, no separate connectors are needed to electrically couple the ECU circuitry 20 to the ignition coils 16 and injectors. Ordinarily, without separate connectors, if the ECU circuitry 20 or a single extension 32 or ignition coil 16 needed replacement, then all connected components would have to be replaced, despite operating properly. However, using a splice clamp 34 of the present invention (see FIG. 2), one or more failed extensions 32 or coils 16 can be serviced or replaced individually. Moreover, using such a splice clamp 34 allows replacement of the ECU circuitry 20 without replacing the coils 16. Thus, the present invention reduces initial material and assembly costs by obviating connectors and reduces replacement costs by facilitating replacement of only the failed or damaged component. While obviating connectors is a primary advantage of the present invention, it should be noted that pin connectors (not shown) could be used at the ends of the extensions 32, if desired, so that the ignition coils 16 and injectors can be unplugged from the ECU circuitry 20.

For example, the splice clamp 34 can be used to splice an extension 32 to a replacement extension 36 attached to a replacement coil 17. The extension replacement 36 has the same width and splice region configuration (i.e., quantity and spacing of conductors, contact pads, and alignment openings), as described above for the extensions 32.

Figure 5B:
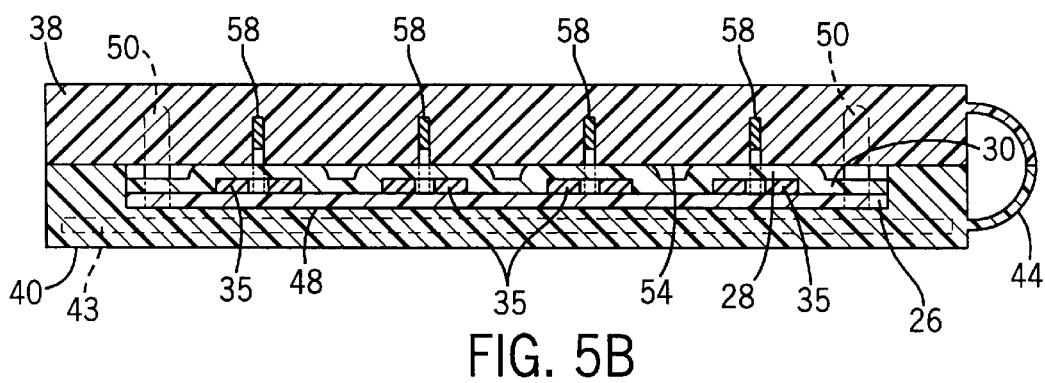
FIG. 5B is a side cross-sectional view taken along line 5B—5B of FIG. 4.
Figure 5C:
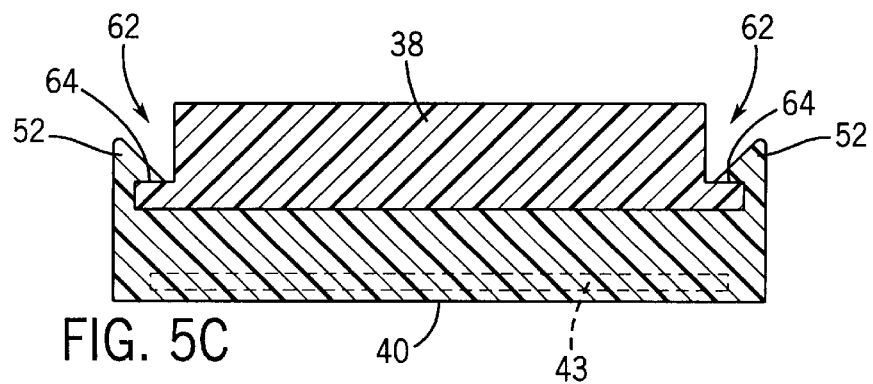
FIG. 5C is an end cross-sectional view taken along line 5C—5C of FIG. 4.

Specifically, the splice clamp 34 includes upper 38 and lower 40 plates joined together at a back end 42 by a living hinge 44 to form a clam-shell structure injection molded of a suitable plastic resin. Referring to momentarily to FIGS. 5A–5C, a rigid stiffener 43 (shown in phantom in the lower plate 40) can be insert-molded into one or both plates to provide additional structural support. In any event, the lower plate 40 has a lateral recess 46 slightly larger than the width and slightly deeper than the thickness of the extensions 32. The recess 46 has a planar bottom surface 48 upon which the spliced extensions rest and four alignment posts 50 projection up therefrom. The alignment posts 50 are longitudinally spaced to mate with the alignment openings 39 in the extensions and replacement extensions 36 (see FIG. 1A). The alignment posts 50 are laterally spaced so that the ends to be spliced nearly abut but do not overlap the replacement extension 36 (see FIG. 3).

The upper plate 38 includes a flat top surface 54 having recesses 56 registered with the alignment posts 50 and sized to contain the alignment posts 50 when the splice clamp 34 is closed together. Molded integrally with the top plate 38 are inverted U-shaped metallic jumpers 58, preferably a copper alloy such as phosphor bronze, having pointed tips 60 projecting downward through the top surface 54. The tips 60 are pointed to cut through the insulating coating 30 over the conductive layer 28 (see FIG. 5A). The jumpers 58 are sized and spaced according to the conductor runs 33 of the extensions 32 being spliced (see FIG. 1A). It should be noted that the figures show four such jumpers 58, however, the number of jumpers 58 will depend upon the number of conductor runs contained in the extensions being spliced. Moreover, the figures show the jumpers 58 extending from the top surface 54 a uniform distance, however, this could be varied so that the jumpers 58 make contact with conductors lying in different planes, as in an etched composite circuit board.

Figure 2:
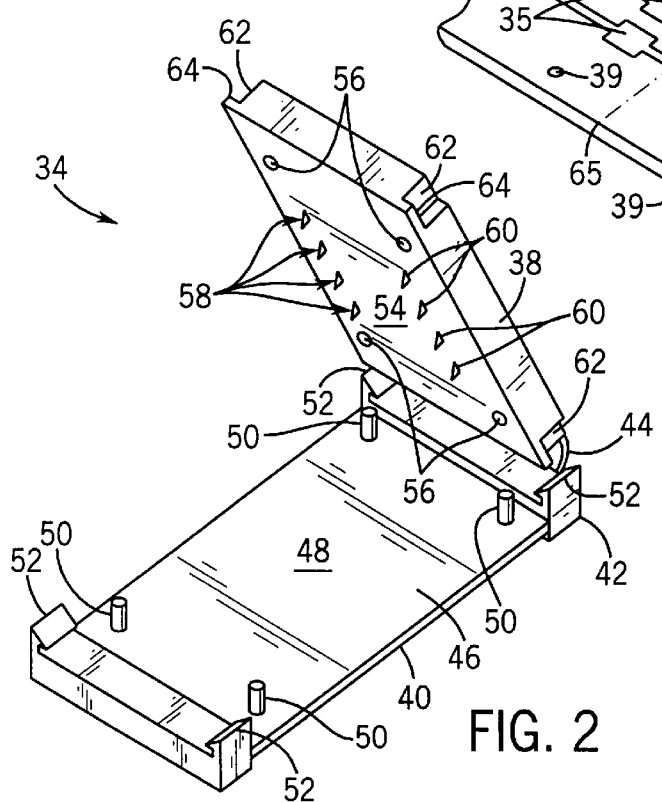
FIG. 2 is a front perspective view of a splice clamp of the present invention in an open position.

Referring to FIGS. 2 and 5C, the lower plate 40 has tapered clasps 52 projecting upward at its corners. The top plate 38 also includes notched corners 62 providing catch surfaces 64 for mating with the clasps 52 of the bottom plate 40. When the plates 38 and 40 are brought together, the clasps 52 are deflected outward by the upper plate 38 until they engage the catch surfaces 64 of the notched corners 62. In this way, the plates 38 and 40 are locked together. The clasps 52 can be pulled outward to unlock the splice clamp 34.

Referring again to FIG. 1, coils 16, extensions 32 or the ECU circuitry 20 are replaced by cutting the necessary extension(s) 32 at the splice region 37 slightly below the contact pads 35. Any suitable shear, scissors or dedicated cutting tool can be used. Moreover, the splice clamp 34 could include an integral blade (not shown) suitably disposed at the upper 38 or lower 40 plate so that no additional tool is needed to cut and connect the replacement extension 36 to the extension 32. The failed or damaged component is then removed and substituted by a replacement component, such as replacement coil 17, having the replacement extension 36. As mentioned, at its free end, the replacement extension 36 includes a splice region having the same width, conductor configuration and alignment openings as the extensions 32.

Figure 3:
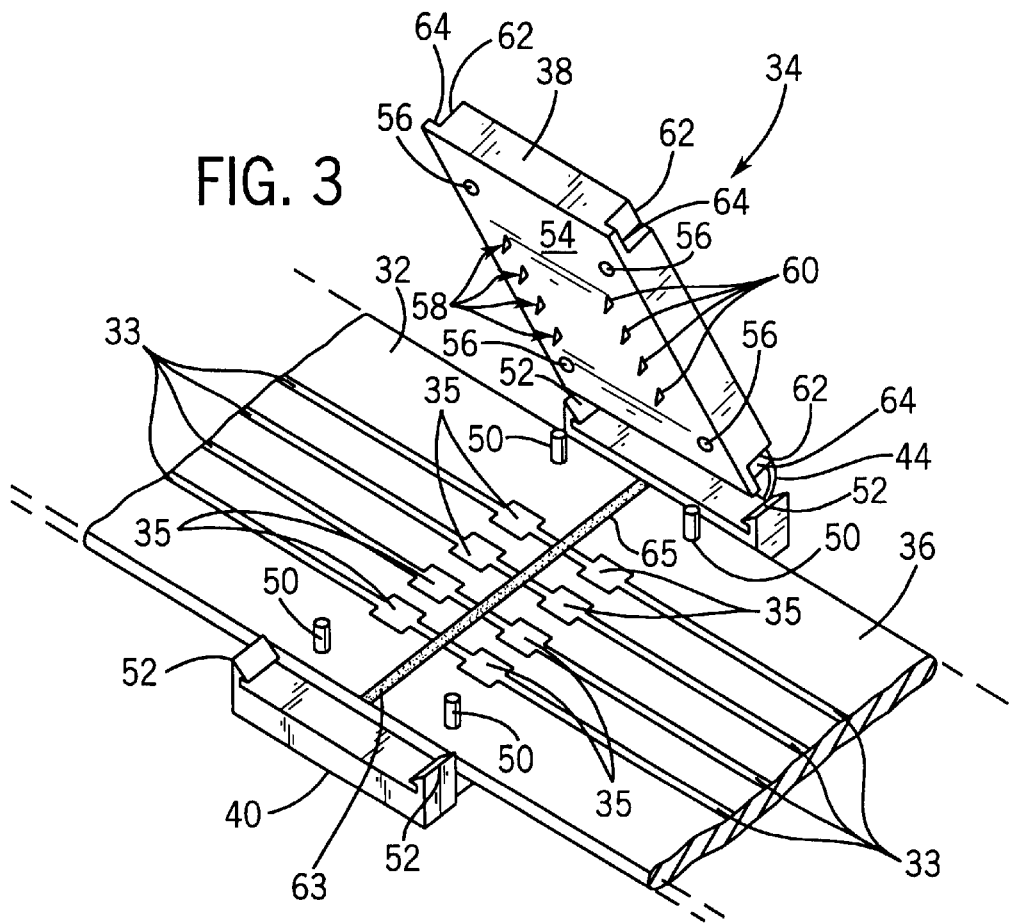
FIG. 3 is a perspective view the splice clamp of FIG. 2 having flexible circuit board sections aligned for splicing.
Figure 4:
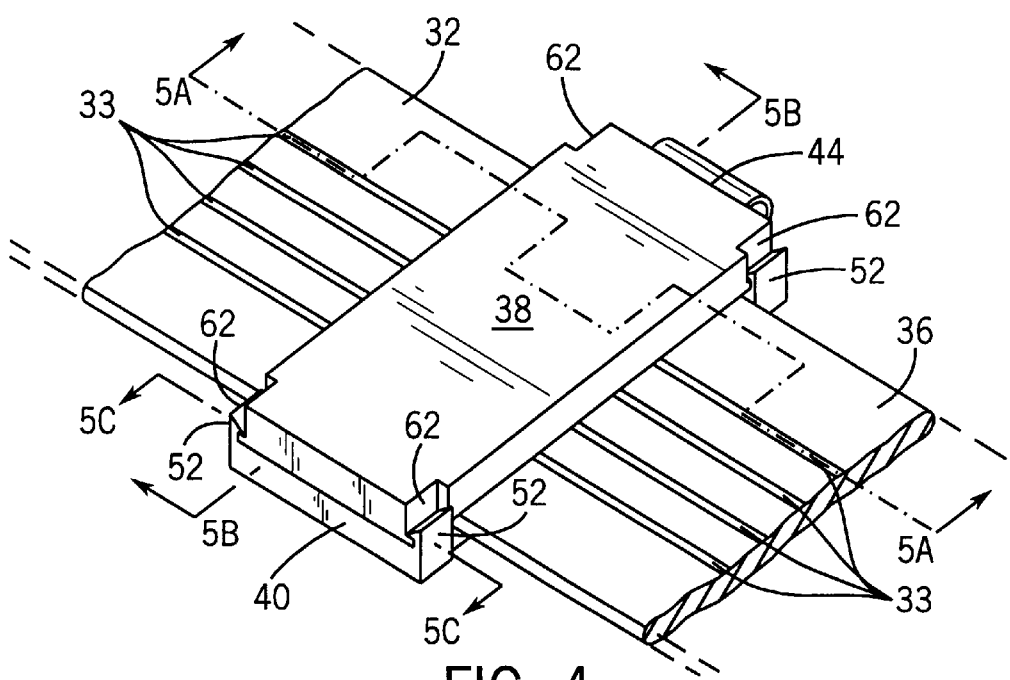
FIG. 4 is a perspective view similar to FIG. 3, however, with the clamp closed so that the flexible circuit board sections are electrically spliced together.

Referring to FIG. 3, the cut extension 32 and the replacement extension 36 are each aligned in the splice clamp 34 so that the alignment openings 39 fit over the alignment posts 50. A bead sealant 63, preferably silicon based, is laid over a seam 65 to encapsulate the conductor runs 33 and prevent possible corrosion along the seam 65. Then, the recesses 56 of the upper plate 38 are aligned with the alignment posts 50 and the upper 38 and lower 40 plates are brought together so that the seam 65 is covered. Applying a clamping force, such as by squeezing the splice clamp 34 by hand, forces the jumper tips 60 through the insulation layer 30 to contact the contact pads 35, as shown in FIGS. 5A–5B. The clasps 52 of the bottom plate to engage the catches 64 of the top plate 38 to lock the jumpers 58 in contact with the contact pads 35. In this way, the electrical connection to the replacement component is established and maintained.

Figure 6:
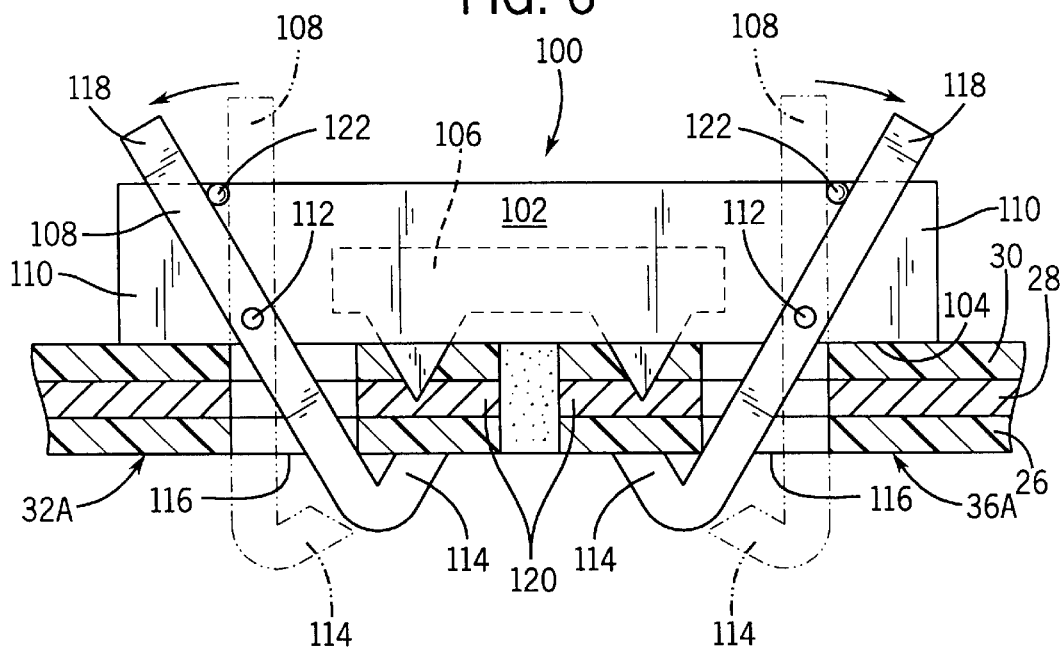
FIG. 6 is an end cross-sectional view of an alternate embodiment of the splice clamp.

An alternate embodiment of the splice clamp of the present invention is shown in FIG. 6. In this embodiment, the splice clamp 100 includes a planar body 102 supporting at a bottom side 104 a set of inverted U-shaped jumpers 106 aligned in parallel. Two pivot legs 108 are attached at each end 110 of the planar body 102 at pivot posts 112. The pivot legs 108 have feet 114 angling inward toward each other. This alternate clamp 100 is used by fitting the pivot legs 108 into two alignment slots 116 at the splice region of each extension 32A and replacement extension 36A, so that the planar body 102 covers the seam. By pulling the top ends 118 of the pivot legs 108 outward, the pivot legs 108 pivot about the pivot posts 112 so the feet 114 press upwardly against the bottom of each extension 32A and replacement extension 36A. In this way, the splice clamp 100 forces the jumpers 106 in contact with contact pads 120 to electrically couple the extension 32A to the replacement extension 36A. The legs 108 then can be suitably held in a locked position, such as by integral bosses 122.

Figure 7:
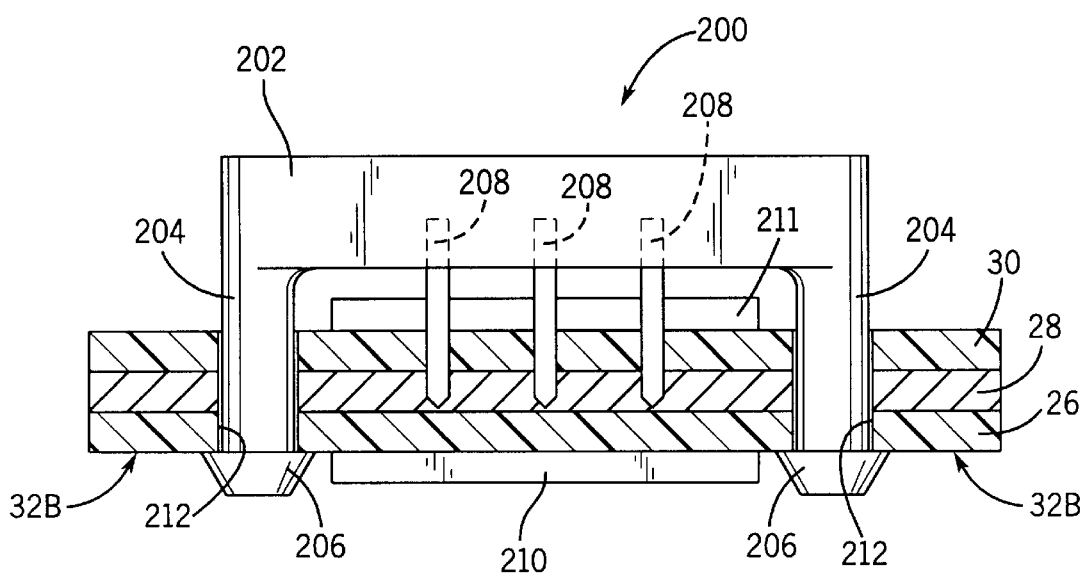
FIG. 7 is a side cross-sectional view of another embodiment of the splice clamp.

Referring now to FIG. 7, a second alternate embodiment of the splice clamp of the present invention is shown. In this embodiment, the splice clamp 200 includes an inverted U-shaped body 202 having legs 204 with feet 206 defining catch surfaces. The body 202 has downwardly extending inverted U-shaped jumpers 208 (three shown) and a support backing 210 hingedly attached at one end to an upper support 211. This embodiment is used by inserting the legs 204 into alignment openings 212 in the extension 32B and replacement extension 36B so that the feet 206 catch bottom surfaces 214. The support backing 210 is than pressed toward the body 202 so that the jumpers 208 contact the contact pads of the extension 32B and replacement extension 36B.

Figure 8A:
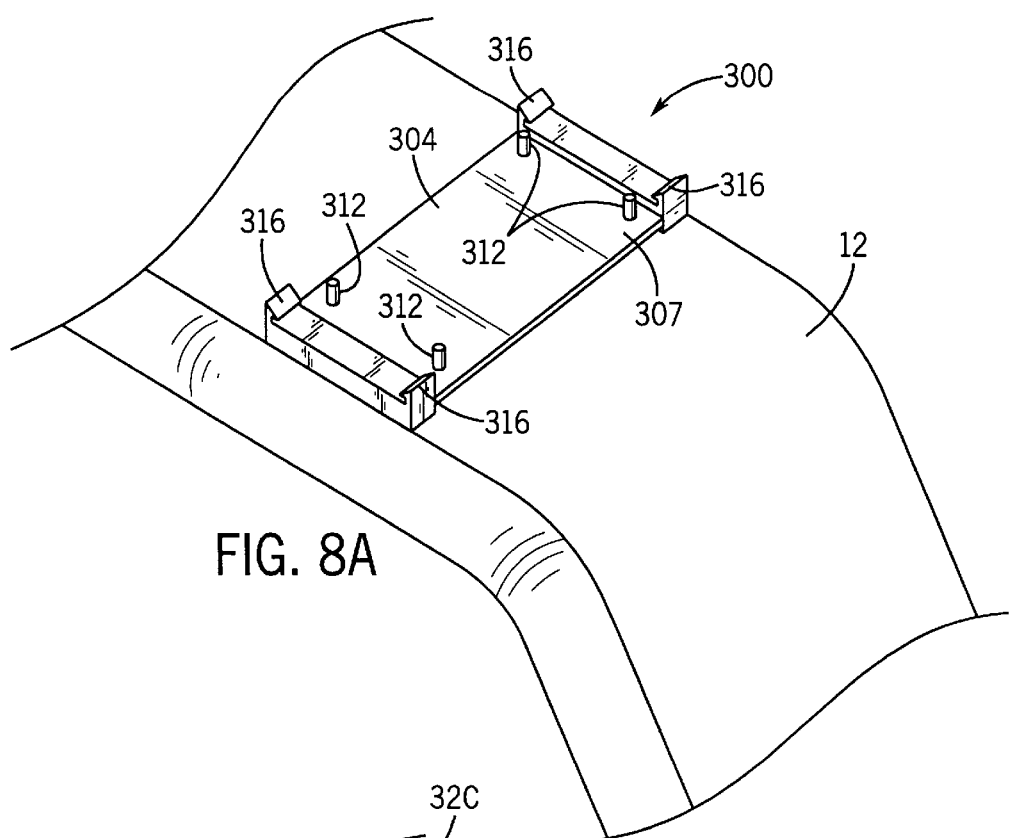
FIG. 8A is a perspective view of an another embodiment of the present invention with two separate plates, one of which is integrally mounted to a support for an electronic component.
Figure 8C:
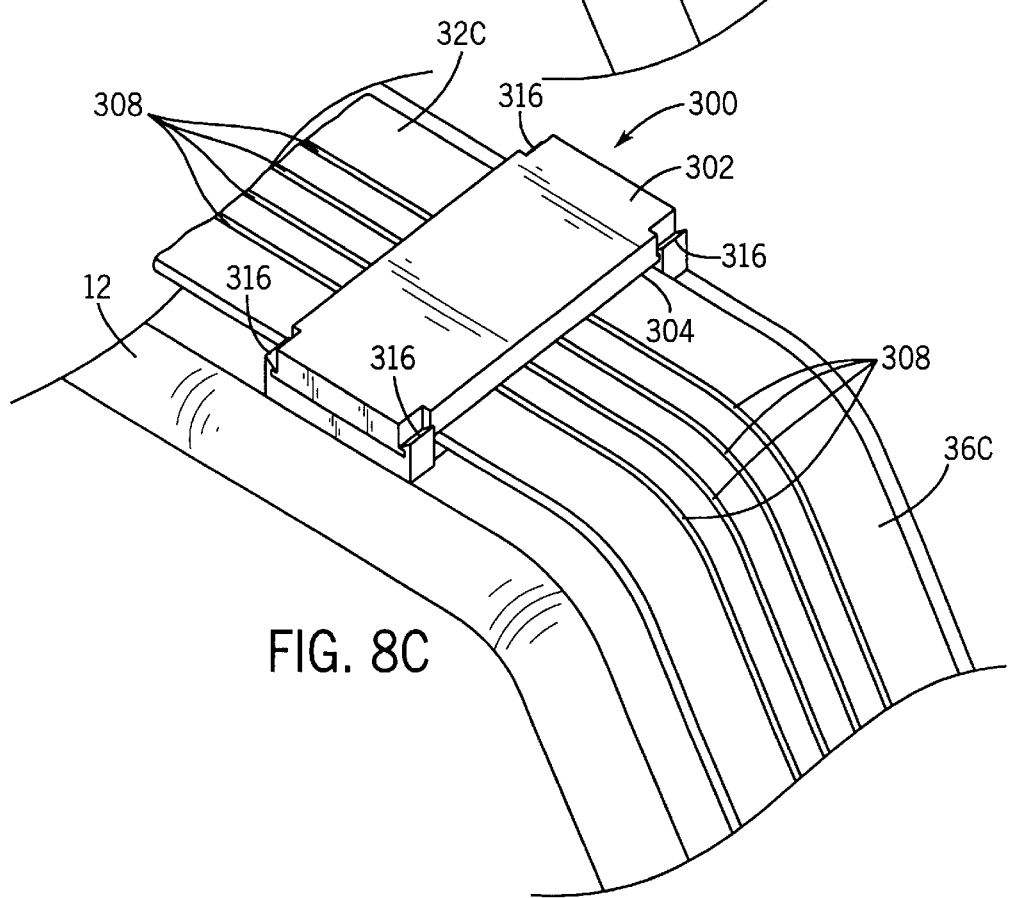
FIG. 8C is a perspective view of the embodiment of FIG. 8A, shown with the upper plate connected to the lower plate so as to splice the extension to replacement extension together.
Figure 8B:
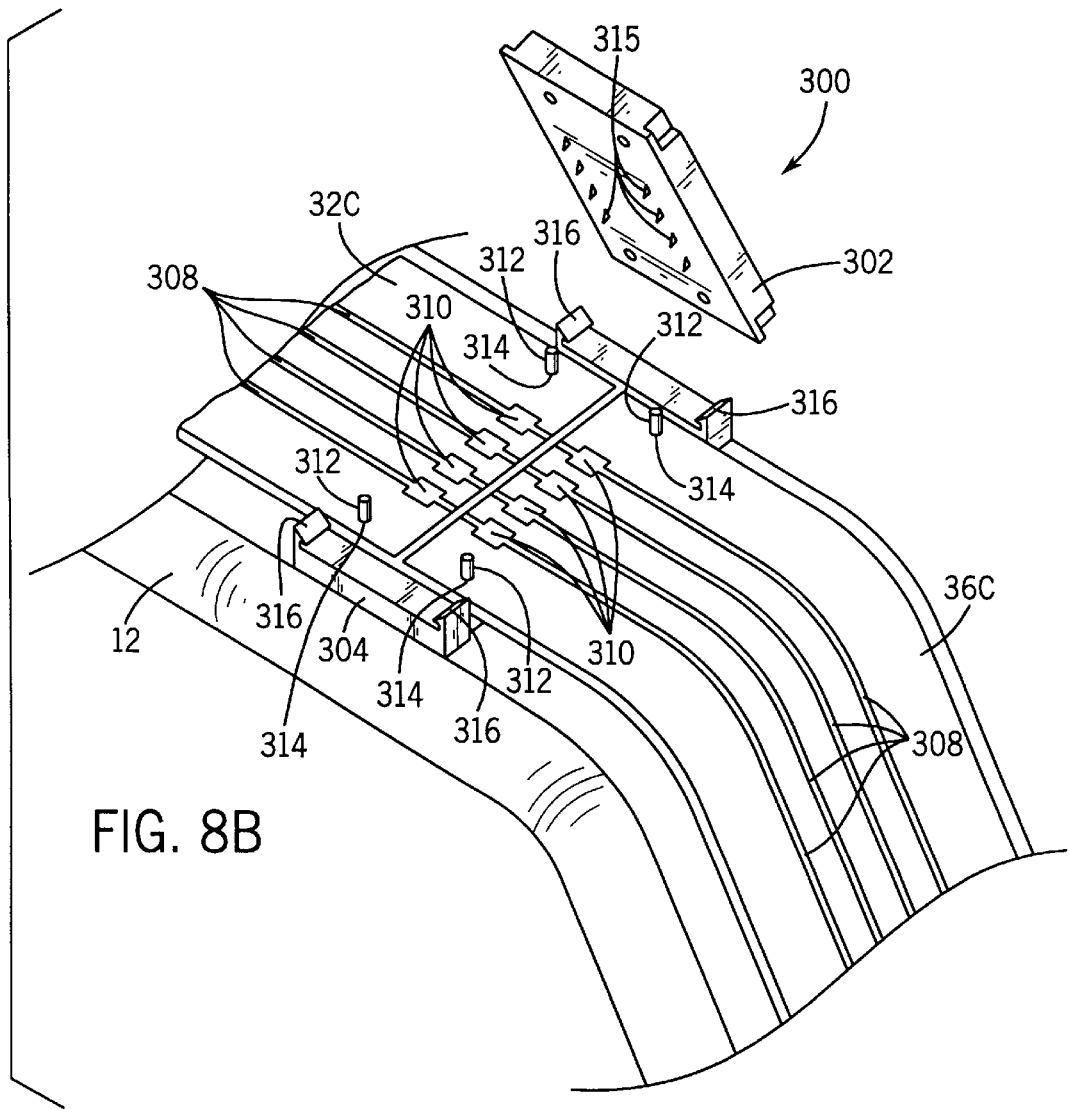
FIG. 8B is a perspective view of the embodiment of FIG. 8A, shown with the extension and replacement extension in the lower plate.

In yet another alternate embodiment shown in FIGS. 8A–8C, the splice clamp 300 is similar to the preferred embodiment, however, the upper 302 and lower 304 plates are separate, rather than joined by a hinge. And, the upper 302 or 304 lower plate is insert molded or otherwise made integral with a support for one of the electronic components in a location proximate the extension 32C. FIG. 8A shows the lower plate 304 molded into the air intake manifold 12 beneath the extension 32C proximate its splice region 37 (as shown in FIG. 1A). Referring to FIGS. 8B and 8C, the splice ends of the extension 32C and replacement extension 36C are aligned in a recess 307 in the lower plate 304 so that their conductor runs 308 and contact pads 310 are aligned (by mating alignment posts 312 in alignment openings 314). The upper plate 302 (having jumpers 315) is engaged with the lower plate 304 by clasps 316 at the corners. The upper 302 and lower 304 plates are then clamped around the extension 32C and replacement extension 36C to electrically couple them together. Although not shown, it should be noted that one of the plates could be integrally joined to a component housing, the extension, the replacement extension and/or any other structure provided the conductor pads of the extension and replacement extension can be aligned and bridged together by the jumpers.

While there has been shown and described what are at present considered the preferred embodiment of the invention, it will be obvious to those skilled in the art that various changes and modifications can be made therein without departing from the scope of the invention. For example, the spliced ends of the flexible circuit board may also be hermetically sealed in various ways, such as by including sealant or an integral or separate resilient seal at the periphery of the upper and lower plates, or including a separate or integral resilient seal in the upper and/or lower plates which extends along a seam line between the extension and replacement extension. Moreover, the jumpers can be arbitrarily shaped stampings that may cross over each other with dielectric material therebetween. Finally, the splice clamp of the present invention can be used with flexible circuit board of different construction, size and conductor configuration to electrically couple two or more electrical components within an automobile or in any other electrical assembly. For example, in an automobile the splice clamp may be used with position, temperature, pressure and airflow sensors, valve controllers, motors, instrument panel devices and cabin environmental controls. Specifically, such devices include a throttle position sensor, an exhaust gas recirculation valve, temperature and manifold absolute pressure sensors, inlet air temperature sensors and by-pass throttle air valve.

Accordingly, reference must be had to the following claims to ascertain the full scope of the invention.

We claim:

1. A kit for use with an automobile electronic assembly having a first engine component coupled to a flexible circuit board by a first extension made of a flexible substrate supporting runs of conductors extending from terminals of the first engine component and having a splice region, the kit comprising:

a replacement engine component for replacing the first engine component and having electrical terminals;

a replacement extension for replacing a portion of the first extension between the splice region and the terminals of the first engine component, the replacement extension having a splice region and being made of a flexible substrate supporting runs of conductors and being electrically coupled to the electrical terminals of the replacement engine component at the other end; and a splice connector having conductive jumpers that can bridge the splice regions and couple the first extension to the replacement extension so that the replacement engine component can be electrically coupled to the flexible circuit board.

2. The kit of claim 1, wherein the splice connector is a clamp having a top plate joined to a bottom plate by a hinge.

3. The kit of claim 1, wherein the hinge is a living hinge integrally connected between the top and bottom plates allowing the splice connector to be opened and closed.

4. The kit of claim 2, wherein the top and bottom plate have planar inner surfaces.

5. The kit of claim 4, wherein the bottom planer surface is recessed approximately the thickness of the extension.

6. The kit of claim 5, wherein the metallic jumpers are disposed within the top plate in a lateral arrangement spaced apart the distance between the runs and having a pair of pointed contact ends protruding through the top inner surface.

7. The of claim 6, wherein the bottom plate two sets of laterally aligned extension alignment posts projecting from the bottom inner surface and the top plate has recesses corresponding to the extension alignment posts in which the extension alignment posts are disposed when the splice connector is closed, the extension alignment posts aligning the free end of the extension with the free end of the replacement extension such that the pointed ends of the metallic jumpers contact the conductive contact pads of the extension and replacement extension when the splice connector is closed.

8. The kit of claim 7, wherein the extension and replacement extension each have a set of alignment openings proximate the conductive contact pads and sized to fit the alignment posts.

9. The kit of claim 2, wherein the bottom plate has a flexible clasp at the unhinged end that engages a catch surface in the top plate so secure the metallic jumpers in contact with the conductive contact pads.

10. The kit of claim 1, wherein the extension and replacement extension have an insulation layer covering the conductor runs.

11. The kit of claim 1, further comprising a seal disposed at the seam between the extension and the replacement extension.

12. The kit of claim 1, wherein each of the first and replacement engine components is selected from the group consisting of: an ignition coil, a fuel injector, an engine control unit, a throttle position sensor, an exhaust recirculation valve, temperature and manifold pressure sensors, inlet air temperature sensors, and a by-pass throttle air valve.

13. The kit of claim 1, wherein the flexible circuit board includes a plurality of extensions coupling the first electronic component to a plurality of second electronic components.

14. The kit of claim 1, wherein the conductors are an etched tri-metal composite comprising a layer of aluminum disposed between layers of copper.

15. The kit of claim 1, wherein of the splice connector includes an integral resilient seal positioned to hermetically seal a seam between the extension and the replacement extension.

16. The kit of claim 1, wherein the splice connector has a first plate and a second plate and wherein the first plate is integrally mounted to a support for the flexible circuit board of the first electronic component.

17. The kit of claim 16, wherein the first plate has a recessed channel and alignment posts for containing and aligning, respectively, splice ends of the fingerlike extension and the replacement extension when splicing the finger-like extension to the replacement extension.

18. The kit of claim 17, wherein the first and second plates can be fit together around the splice ends of the finger-like extension and the replacement extension.

19. In an automobile electronic assembly including a first electronic component having a flexible circuit board with a flexible circuit extension made of a flexible substrate supporting conductor runs wherein the flexible circuit extension electrically couples the first electronic component to a second electronic component, a method of servicing the electronic assembly, comprising the steps of:

cutting through the flexible circuit extension cross-wise so that the extension is in two segments, a first segment connected to the first electronic component and a second segment connected to the second electronic component;

removing the first electronic component and the first extension segment;

installing a replacement component having a replacement extension segment corresponding to the first electronic component and the first extension segment;

bringing together free ends of the second extension segment and the replacement extension segment so that the conductor runs of the second extension segment are aligned with the conductor runs of the replacement extension segment; and clamping a splice connector with metallic jumpers over the free ends so that the metallic jumpers bridge the conductor runs of the second extension segment to that the conductor runs of the replacement extension segment.

20. The method of claim 19, wherein the splice connector is a clamp having a top plate joined to a bottom plate by a hinge allowing the splice connector to be opened and closed.

21. The method of claim 20, wherein the metallic jumpers are disposed within the top plate in a lateral arrangement spaced apart the distance between the runs and having a pair of contact ends protruding through a top inner surface.

22. The method of claim 21, wherein the conductor runs have conductive contact pads of increased width than the runs and wherein the extension is cut such that the conductive contact pads are in the second extension segment.

23. The method of claim 22, wherein the bottom plate has two sets of laterally aligned extension alignment posts projecting from a bottom inner surface and the top plate has recesses corresponding to the extension alignment posts in which the extension alignment posts are disposed when the splice connector is closed, and wherein the second and replacement extension segments each have a set of alignment openings proximate the conductive contact pads and sized to fit the alignment posts.

24. The method of claim 23, further comprising the step of:
aligning the openings in the second extension segment and the openings in the replacement extension segment such that the pointed ends of the metallic jumpers contact the conductive contact pads of the second and replacement extension segments when the splice connector is closed.

25. The method of claim 24, further including the step of sealing the seam between the second and replacement extension segments.

26. The method of claim 25, wherein the bottom plate has a flexible clasp at the unhinged end and the top plate has a catch surface at the unhinged end, further comprising the step of snapping the splice connector closed.

27. The method of claim 26, wherein the second and replacement extension segments have an insulation layer covering the conductor runs, and wherein the jumper contact ends are pointed to cut through the insulation layer and contact the conductive contact pads when the splice connector is closed.

28. The method of claim 19, wherein each of the first and second electronic components is selected from the group consisting of: an ignition coil, a fuel injector, an engine control unit, a throttle position sensor, an exhaust gas recirculation valve, temperature and manifold absolute pressure sensors, inlet air temperature sensors, and by-pass throttle air valve.

29. The method of claim 19, wherein the conductors are an etched tri-metal composite comprising a layer of aluminum disposed between layer of copper.

* * * * *

UNITED STATES PATENT AND TRADEMARK OFFICE
CERTIFICATE OF CORRECTION

PATENT NO.   : 6,299,469 B1
DATED        : October 9, 2001
INVENTOR(S)  : Andrew Z. Glovatsky et al.

It is certified that error appears in the above-identified patent and that said Letters Patent is hereby corrected as shown below:

<u>Column 5,</u>
Line 13, "comers" should be -- corners --;

<u>Column 7,</u>
Line 37, "The of claim 6" should be -- The kit of claim 6 --; and
Line 37, "plate two" should be -- plate has two --.

Signed and Sealed this

Twenty-eighth Day of May, 2002

Attest:

JAMES E. ROGAN
*Attesting Officer*          *Director of the United States Patent and Trademark Office*